(12) United States Patent
Ikegami

(10) Patent No.: US 7,560,763 B2
(45) Date of Patent: Jul. 14, 2009

(54) SEMICONDUCTOR DEVICE AND METHOD FOR FABRICATING THE SAME

(75) Inventor: Masami Ikegami, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 560 days.

(21) Appl. No.: 11/129,293

(22) Filed: May 16, 2005

(65) Prior Publication Data

US 2006/0255439 A1    Nov. 16, 2006

(51) Int. Cl.
*H01L 21/336* (2006.01)
(52) U.S. Cl. .................. 257/315; 438/257; 257/E21.68
(58) Field of Classification Search ......... 438/257–267, 438/210, 238, 329, 381; 257/314–321, 516, 257/E21.68, E21.681
See application file for complete search history.

(56) References Cited

U.S. PATENT DOCUMENTS

| | | | | |
|---|---|---|---|---|
| 5,275,963 A | * | 1/1994 | Cederbaum et al. ......... | 438/624 |
| 5,789,293 A | * | 8/1998 | Cho et al. .................... | 438/257 |
| 5,852,311 A | * | 12/1998 | Kwon et al. ................. | 257/315 |
| 6,020,229 A | * | 2/2000 | Yamane et al. .............. | 438/201 |
| 2004/0070033 A1 | * | 4/2004 | Shin ........................... | 257/379 |

FOREIGN PATENT DOCUMENTS

JP    06-151456    5/1994

* cited by examiner

*Primary Examiner*—Brook Kebede
(74) *Attorney, Agent, or Firm*—Rabin & Berdo, PC

(57) ABSTRACT

A semiconductor device, includes a semiconductor substrate; a first insulating layer formed on the semiconductor substrate; a first electrode formed on the first insulating layer; an interlayer dielectric formed over the first electrode; a wiring layer formed over the interlayer dielectric; a first contact hole formed through the interlayer dielectric between the first electrode and the wiring layer; and a barrier metal layer formed on an inner surface of the first contact hole. The first contact hole is formed to pass through the first electrode and reach an inside of the first insulating layer.

25 Claims, 7 Drawing Sheets

SEMICONDUCTOR DEVICE AND METHOD FOR FABRICATING THE SAME

TECHNICAL FIELD OF THE INVENTION

The present invention relates generally to a semiconductor device and a method for manufacturing the same; and more particularly to, contact for a thin-film poly-Si gate in a multi-layered semiconductor device.

BACKGROUND OF THE INVENTION

A conventional multi-layered semiconductor device may include a contact hole, which electrically couples a wiring pattern, formed in an upper layer, to an electrode, formed in a lower layer. A barrier metal may be formed on an inside surface of the contact hole, and is alloyed with the electrode in a RTN (Rapid Thermal Nitridaition) process. After the RTN process, a contact material is filled in the contact hole. However, according to the conventional semiconductor device, voids may be formed between the contact material and the electrode. As a result, electrical connection between the wiring pattern and the electrode would be deteriorated.

OBJECTS OF THE INVENTION

Accordingly, it is an object of the present invention to provide a semiconductor device in which reliable contact is provided between a wiring layer and an electrode, which are formed in the different layers.

Another object of the present invention to provide a method for fabricating a semiconductor device in which reliable contact is provided between a wiring layer and an electrode, which are formed in the different layers.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device, includes a semiconductor substrate; a first insulating layer formed on the semiconductor substrate; a first electrode formed on the first insulating layer; an interlayer dielectric formed over the first electrode; a wiring layer formed over the interlayer dielectric; a first contact hole formed through the interlayer dielectric between the first electrode and the wiring layer; and a barrier metal layer formed on an inner surface of the first contact hole. The first contact hole is formed to pass through the first electrode and reach an inside of the first insulating layer. The barrier metal layer is formed after the first contact hole is completely formed.

The first insulating layer may be an element-isolation region, which isolates adjacent semiconductor elements. The barrier metal layer may be of a material selected from Ti, W, Mo, TiSi, TiN, TiW and WSi. The first electrode may be of Poly-Silicon. The barrier metal layer may be alloyed with the first electrode by an RTN (Rapid Thermal Nitridation) process.

Preferably, the first contact hole is formed by a two-step process, in which an intermediate hole is formed to an upper surface of the first insulating layer in a first step and the first contact hole is completed in a second step. The first and second steps may be of etching process with different process conditions.

The semiconductor device may further include a second insulating layer formed over the first electrode; and a second electrode formed on the second insulating layer. The first electrode may be a lower gate of a capacitor, and the second electrode may be an upper gate of a capacitor.

The semiconductor device may include a pair of contact holes, and the first electrode is of a resistor.

The semiconductor device may further include a non-volatile memory cell formed on the semiconductor substrate. The non-volatile memory cell may include a source region formed on the semiconductor substrate; a drain region formed on the semiconductor substrate; a tunnel oxide layer formed over the source and drain region; a second contact hole formed through the interlayer dielectric between one of the source and drain regions and the wiring layer; and a third contact hole formed through the interlayer dielectric between one of the source and drain regions and the wiring layer.

As described above, according to the present invention, the first contact hole is formed to pass through the first electrode and reach an inside the first insulating layer, so that only a side surface of the first electrode is in contact with the barrier metal layer. In other words, the barrier metal layer and the first electrode are in contact with each other at a smaller area. Since the barrier metal layer is formed by a sputtering process, the barrier metal layer has a larger thickness at the bottom of the first contact hole, which is about double of the inner-side surface of the first contact hole. Therefore, reaction velocity (rate) between Ti in the barrier metal layer and silicon in the first electrode is decreased. As a result, voids can be prevented from being formed in the first electrode, and electrical connection between the wiring pattern in the upper layer and the first electrode in the lower layer would be reliable.

According to a second aspect of the present invention, a method for fabricating a semiconductor device, including the steps of providing a semiconductor substrate; forming a first insulating layer on the semiconductor substrate; forming a first electrode on the first insulating layer; forming an interlayer dielectric over the first electrode; forming a first contact hole through the interlayer dielectric to pass through the first electrode and reach an inside of the first insulating layer; forming a barrier metal layer on an inner surface of the first contact hole; and forming a wiring layer on the first contact hole so that the wiring layer is electrically coupled to the first electrode.

The first insulating layer may be an element-isolation region formed by LOCOS technique.

Preferably, the step forming the first contact hole includes the steps of forming an intermediate hole is to an upper surface of the first insulating layer; and completing the first contact hole to get into the first insulating layer. The step forming the first contact hole is carried out by two step of etching process with different conditions.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1A:
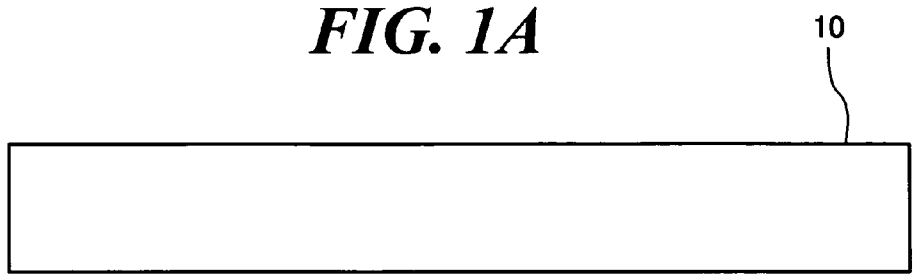
FIGS. 1A-1L are cross-sectional views showing fabrication steps of a semiconductor device according to a first preferred embodiment of the present invention.
Figure 1B:
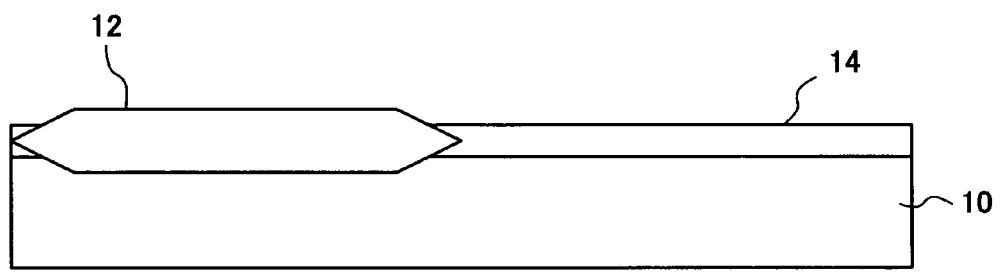

FIGS. 1A-1L are cross-sectional views showing fabrication steps of a semiconductor device according to a first preferred embodiment of the present invention. First, as shown in FIG. 1A, a semiconductor substrate 10 of P-type silicon is provided. Next, as shown in FIG. 1B, an element-isolation region (first insulating layer) 12 is formed on the semiconductor substrate 10 by a LOCOS (Local Oxidation of Silicon) process. The element isolation region 12 is of a thermal oxide layer having a thickness of 600 nm. Another thermal oxide layer 14 is formed at an active region on the semiconductor substrate 10 by a wet oxidation process at 900.degree. C. to have a thickness of 10 nm. The thermal oxide layer 14 is to be used as a tunnel oxide layer of a non-volatile memory.

Subsequently, a poly-silicon layer is formed over the oxide layers 12 and 14, by an LP-CVD process. The poly-silicon layer on the oxide layer 14 is to be used as a floating gate of a non-volatile memory. The poly-silicon layer on the oxide layer 12 is to be used as a lower gate of a capacitor. The poly-silicon layer is formed to have a thickness of around 100 nm for a thinner structure and better processability.

Figure 1C:
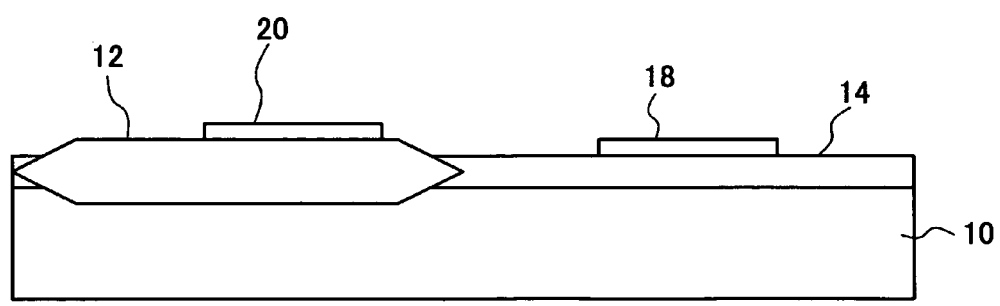

After that, phosphorus is ion-implanted into the poly-silicon layer to make the poly-silicon layer have an N conductive type. The ion implantation process is carried out at P+ 10 KeV 1E15ions, and with an appropriate energy level, which is determined so that Rp existing in the poly-silicon and phosphorus (P) does not get in the tunnel oxide layer 14. Next, as shown in FIG. 1C, a floating gate 18 and a lower gate (first electrode) 20 are formed in a dry etching process using a photo-resist as a mask.

Figure 1D:
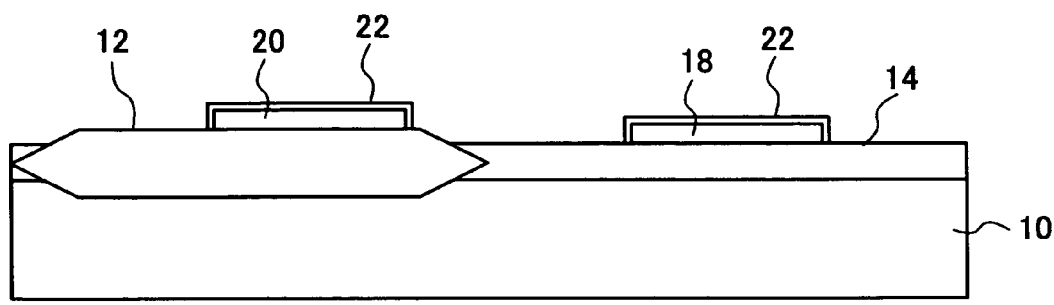

Next, as shown in FIG. 1D, an insulating layer 22 is formed over the floating gate 18 of a non-volatile memory and the lower electrode 20 of a capacitor. The insulating layer 22 is of a thermal oxide layer formed at 1000° C. to have a thickness of 20 nm. The insulating layer 22 may have triple-layered structure, in which a nitride layer is arranged between upper and lower oxide layers.

After that, a W-polycide layer, which is to be functioning finally as a control gate of a non-volatile memory and an upper gate of a capacitor, is formed over the insulating layer 22. In this process, first, a poly-silicon layer is formed by an LP-CVD process to have a thickness of 100 nm; then phosphorus (P) having a density of about 4E20ions/cm3 is diffused in the poly-silicon layer by a phosphorus diffusion technique. Next, tungsten (W) is formed on the poly-silicon layer to have a thickness of about 100 nm by a sputtering process. After that, as shown in FIG. 1E, a control gate 26 of a non-volatile memory and an upper electrode 24 of a capacitor are formed above the floating gate 18 and the lower electrode 20, respectively, by a dry-etching process using a photo-resist as a mask.

Figure 1E:
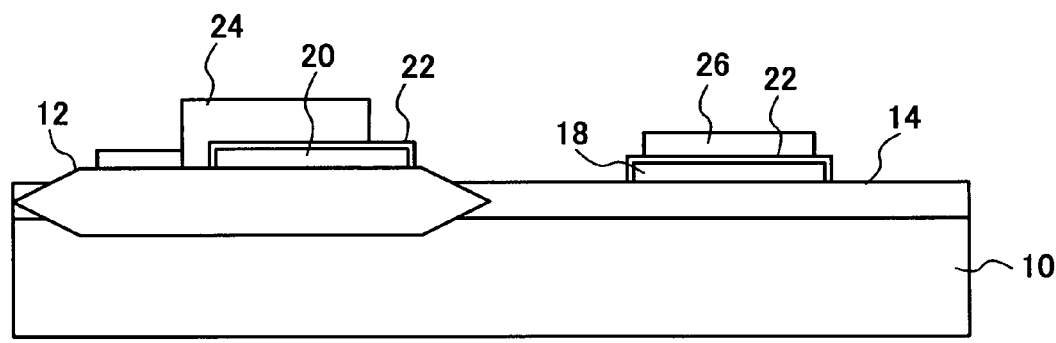
Figure 1F:
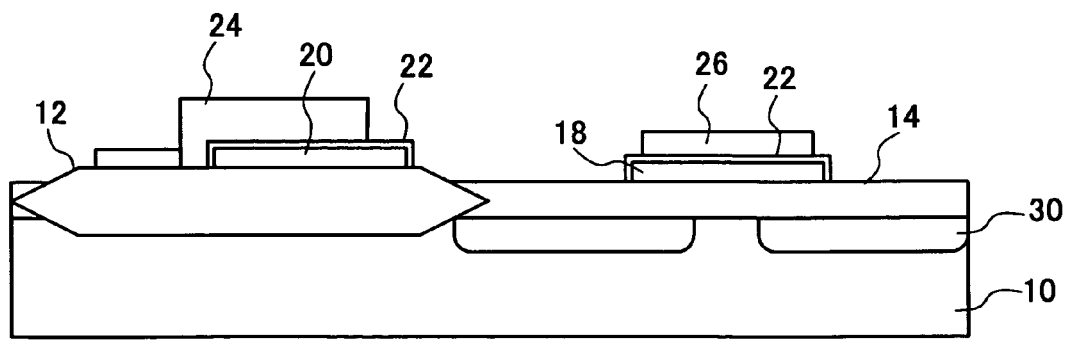

Next, as shown in FIG. 1E, a source/drain region 30, which is an N-type diffusion layer, for a non-volatile memory is formed by an ion-implantation process. The ion-implantation process is carried out at As+ 60 KeV 5E15. If a high voltage of 10 v-20 v is applied to a drain in an erase/write operation, a combination of two different conditions of processing, P+ 80 KeV 5E14 and As+ 60 KeV 5E15, would be employed to increase pressure resistance of bonding.

Figure 1G:
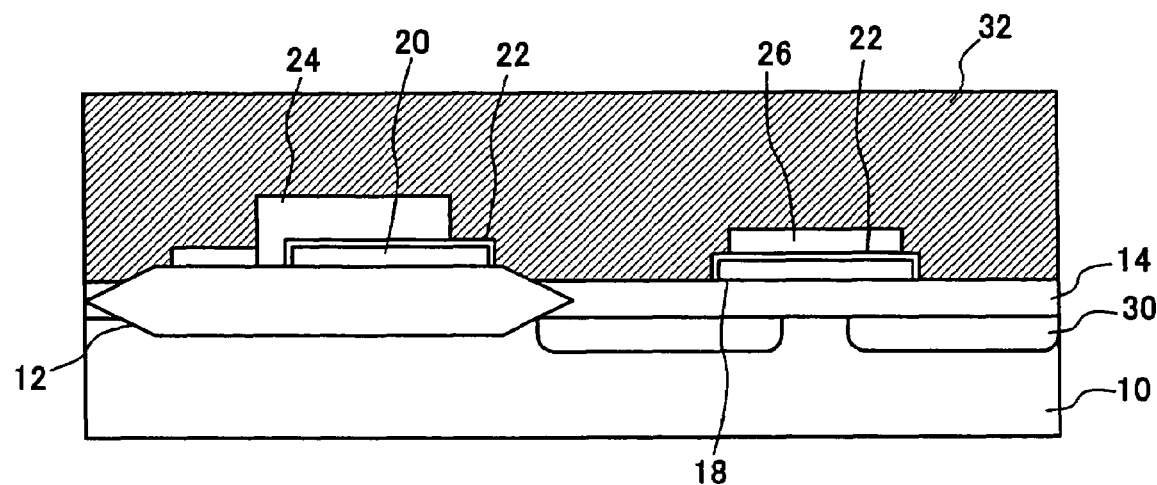

Subsequently, as shown in FIG. 1G, an interlayer dielectric (interlayer insulation) 32 is formed over the entire structure to insulate the electrodes 18, 20, 22 and 24 and a wiring layer (40) from each other. The interlayer dielectric 32 is formed by depositing a BPSG (boro-phospho silicate glass) layer to have a thickness of 800 nm and performing a thermal treatment thereto at 850.degree. C. for thirty minutes to improve flatness.

Figure 1H:
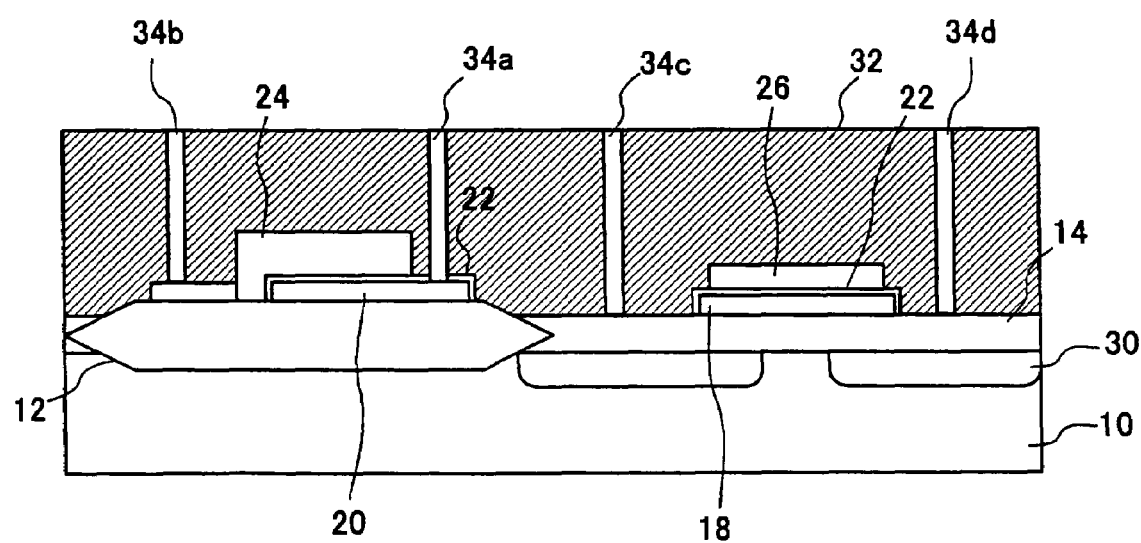
Figure 1I:
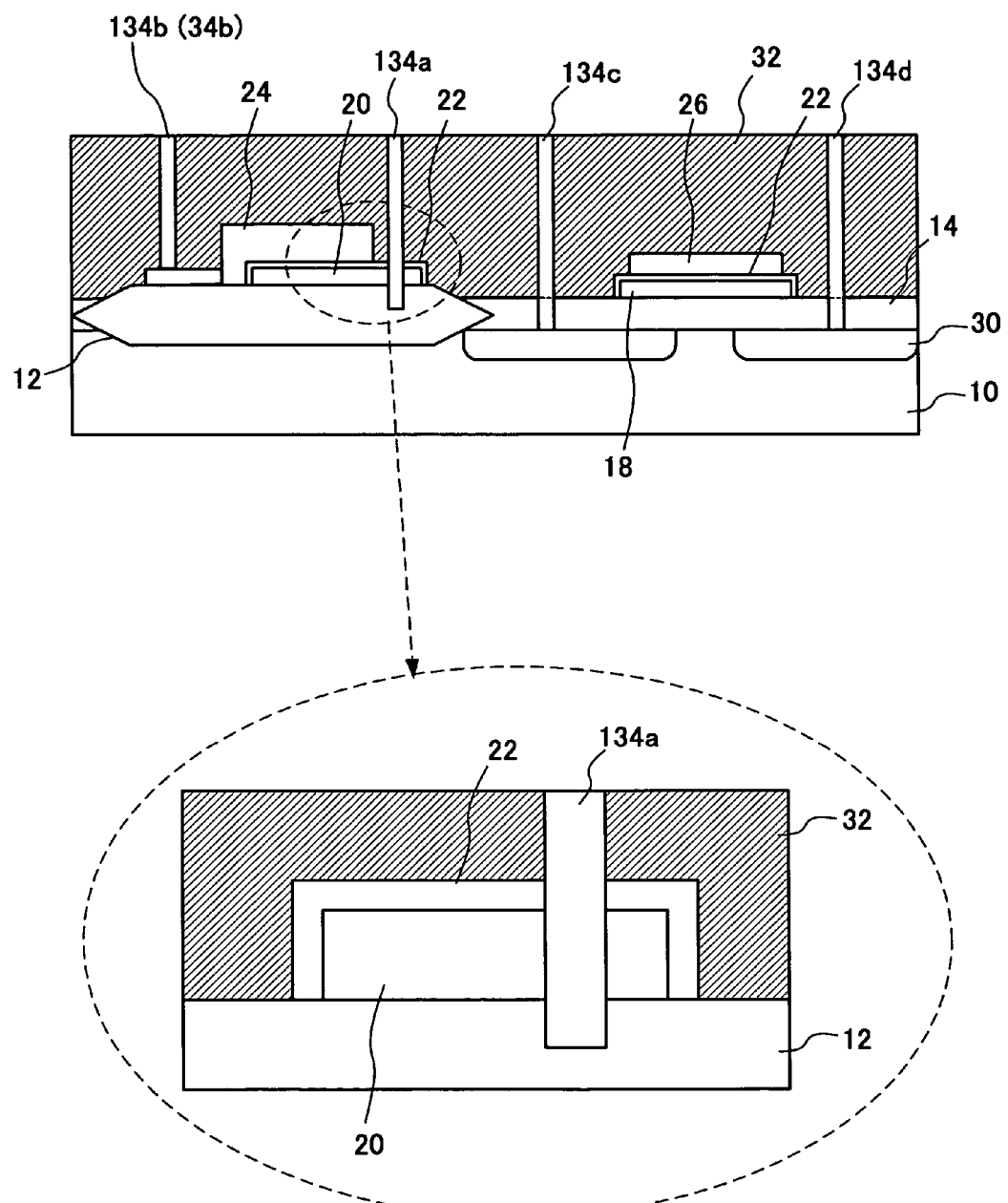

Next, contact holes are formed. Contact holes 134a, 134b, 134c and 134d, to be finally connected to the lower electrode 20 of a capacitor, the upper electrode 34 of the capacitor and source/drain regions 30, are formed in the same process. As shown in FIG. 1H, intermediate contact holes 34a, 34b, 34c and 34d are formed by a first etching process under conditions in which etching rates of silicon and silicon oxide layer are high but an etching rate of tungsten (W) is low. For example, the first etching process is carried out with an etching gas of CF4 or CHF3 at a pressure of 7 Torr and a temperature of −10.degree. C.

The first etching process for contact holes is terminated at upper surfaces of the upper electrode 24 of the capacitor, the element isolation layer 12 and the source/drain region 30 of the non-volatile memory. In other words, the intermediate contact holes 34a and 34b for a capacitor reach upper surfaces of the upper electrode 24 of the capacitor and the element isolation layer 12, respectively. The intermediate contact holes 34c and 34d for a non-volatile memory reach upper surface of the source/drain region 30.

Now referring to FIG. 1H, complete contact holes 134a, 134b, 134c and 134d are formed by a second etching process under conditions in which an etching rate of silicon oxide layer is high but etching rates of silicon and tungsten (W) are low. For example, the second etching process is carried out with an etching gas of HBr, Cl2 or O2 at a pressure of 2 Torr and a temperature of 40.degree. C. The intermediate contact holes 34a, 34c and 34d are now expanded into complete contact holes 134a, 134c and 134d, respectively.

The contact hole (first contact hole) 134a is formed to pass through the lower electrode 20 of a capacitor and reach an inside of the element isolation layer 12. The contact holes 134c and 134d are formed to pass through the oxide layer 14 and reach an upper surface of the source/drain region 30.

Figure 1J:
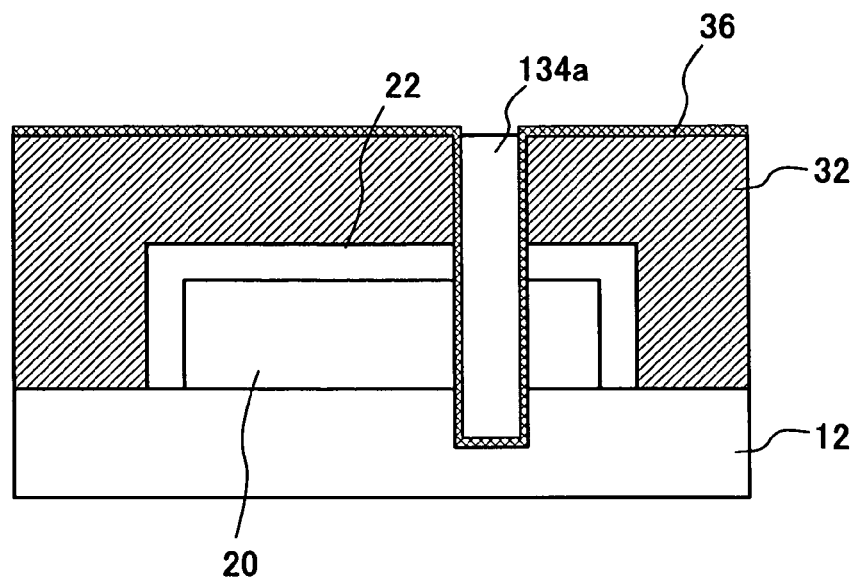
Figure 1K:
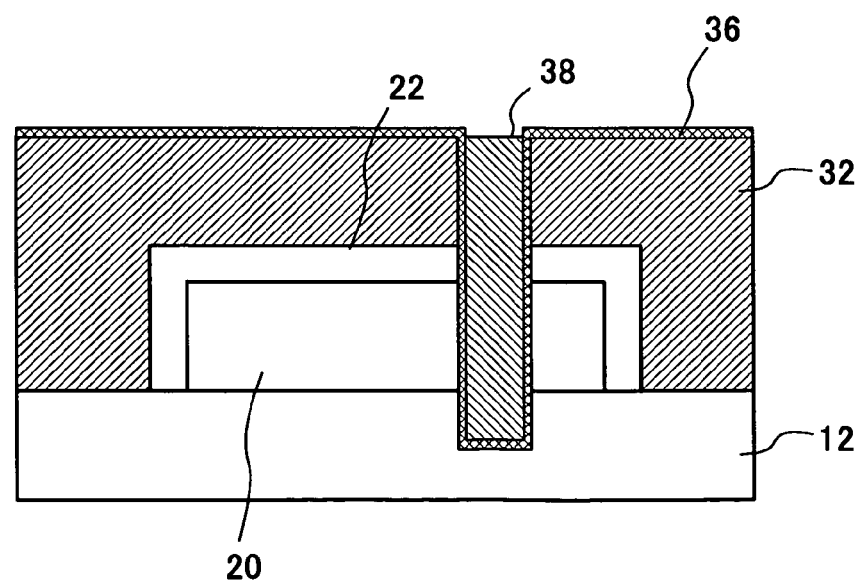

For a clear understanding, each of FIGS. 1J and 1K shows only a region around the lower electrode 20 of a capacitor. As shown in FIG. 1J, a barrier metal layer 36 is formed on an inner surface of the contact holes 134a, 134b, 134c and 134d by a sputtering process to have a thickness of 80 nm. The barrier metal layer 36 may be of a material selected from Ti, W, Mo, TiSi, TiN, TiW and WSi. In this embodiment, Ti is employed as a barrier metal. The barrier metal layer 36 has a thickness of 50-100 nm at the bottoms and 25-50 nm at inner-side surfaces of the contact holes 134a, 134b, 134c and 134d. After that, the barrier metal layer 36 is alloyed with silicon in an RTN (Rapid Thermal Nitridation) process at 800.degree. C. for 30 seconds.

Next, as shown in FIG. 1K, a contact material 38 of W (tungsten) is filled in the contact holes 134a, 134b, 134c and 134d by a CVD process and an anisotropic etching process. In more detail, first a W film is formed in the contact holes 134a, 134b, 134c and 134d by a CVD process, and then, a part of the W film is removed by an anisotropic etching process.

Figure 1L:
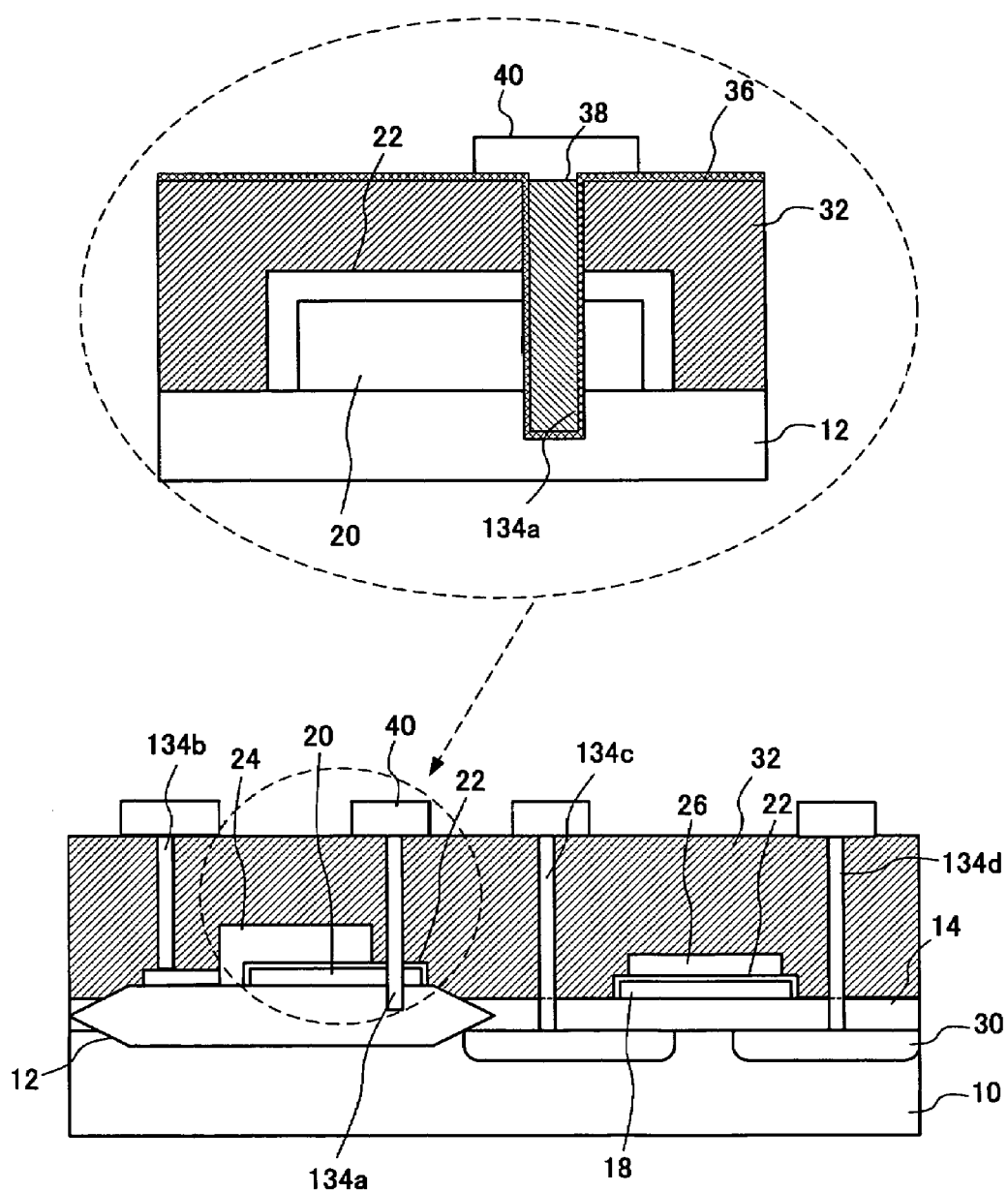

Subsequently, an Al layer is formed on the interlayer dielectric 32 by a sputtering process to have a thickness of 800 nm. After that, as shown in FIG. 1L, the Al layer is patterned to form a wiring layer 40 of Al on the contact holes 134a, 134b, 134c and 134d.

As described above, according to the first preferred embodiment of the present invention, the contact hole 134a is formed to pass through the lower electrode 20 and reach an inside the element isolation region 12, so that only a side surface of the lower electrode 20 is in contact with the barrier metal 36. In other words, the barrier metal layer 36 and the lower electrode 20 are in contact with each other at a smaller area. Since the barrier metal layer 36 is formed by a sputtering process, the barrier metal layer 36 has a larger thickness at the bottom of the contact hole 134a, which is about double of the inner-side surface of the contact hole 134a. Therefore, reaction velocity (rate) between Ti in the barrier metal layer 36 and silicon in the lower electrode 20 is decreased. As a result, voids can be prevented from being formed in the lower electrode 20, and electrical connection between the wiring pattern 40 and the lower electrode 20 would be reliable.

Figure 2:
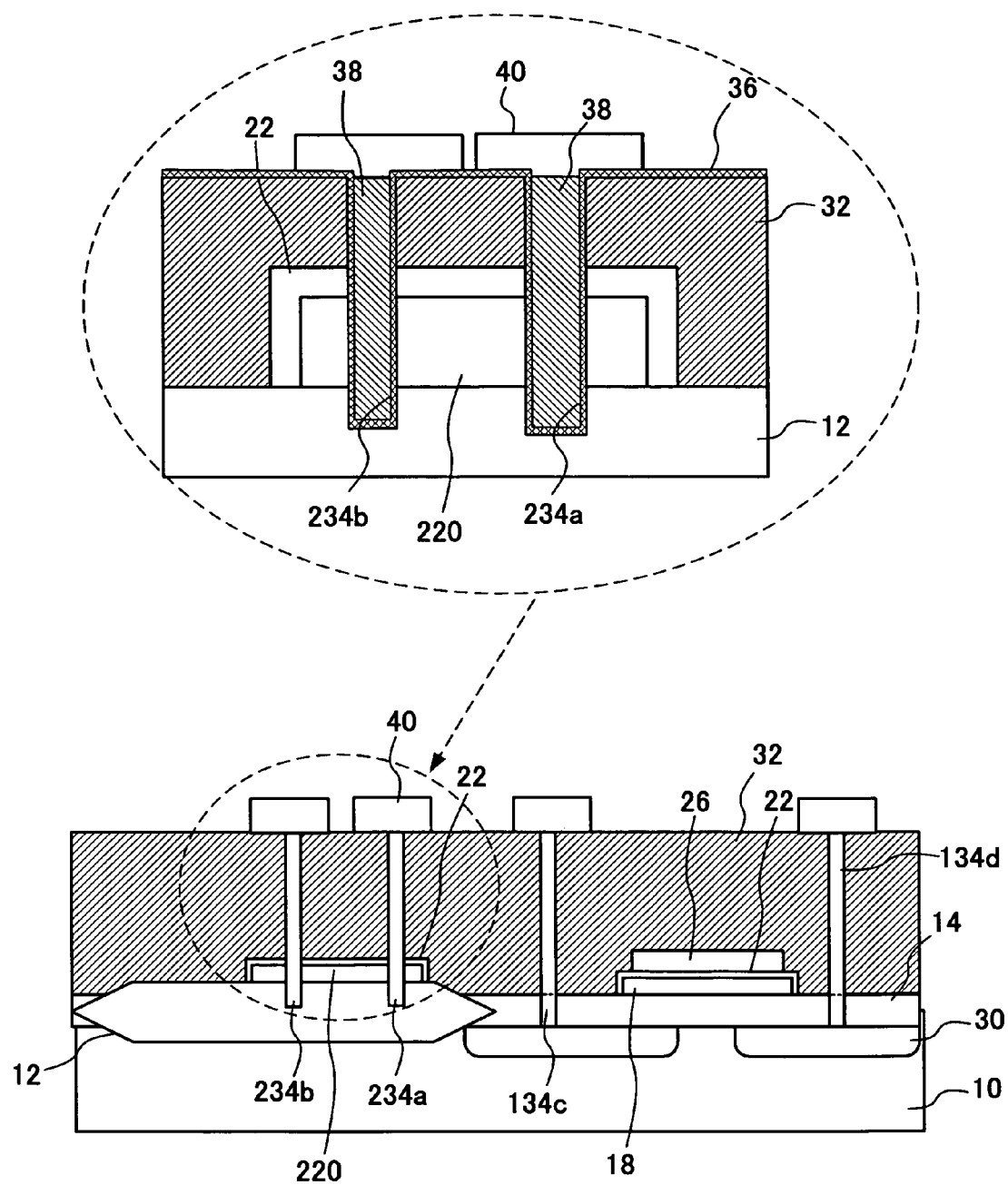
FIG. 2 is a cross-sectional view showing a semiconductor device according to a second preferred embodiment of the present invention.

FIG. 2 is a cross-sectional view showing a semiconductor device according to a second preferred embodiment of the present invention, in which the same or corresponding components to those in FIGS. 1A-1L are represented by the same reference numerals and the same description is not repeated. The second preferred embodiment, shown in FIG. 2, is applied to a poly-resistor, while the first preferred embodiment is applied to a poly-capacitor. The semiconductor device (poly-resistor) includes a pair of contact holes 234a and 234b both of which are formed to pass through an electrode 220 and reach an inside of an element isolation region 12. The semiconductor device according to the second preferred embodiment can be fabricated in the same steps as the first preferred embodiment.

What is claimed is:
1. A semiconductor device, comprising:
a semiconductor substrate;
a first insulating layer formed on the semiconductor substrate;
a first electrode formed on the first insulating layer;
an interlayer dielectric formed over the first electrode;
a wiring layer formed over the interlayer dielectric;
a barrier metal layer formed on an inner surface of a first contact hole;
a second insulating layer formed over the first electrode; and
a second electrode formed on the second insulating layer,
wherein the first contact hole is formed between the first electrode and the wiring layer, to pass through the first electrode and the interlayer dielectric, and to terminate at an inside of the first insulating layer, and
wherein a second contact hole is formed above the first insulating layer so as to be connected to the second electrode.
2. A semiconductor device according to claim 1, wherein the first insulating layer is an element-isolation region, which isolates adjacent semiconductor elements.
3. A semiconductor device according to claim 1, wherein the barrier metal layer is of a material selected from Ti, W, Mo, TiSi, TiN, TiW and WSi.
4. A semiconductor device according to claim 3, wherein the barrier metal layer is of Ti (titanium) and the first electrode is of Poly-Silicon.
5. A semiconductor device according to claim 1, wherein the barrier metal layer is alloyed with the first electrode.
6. A semiconductor device according to claim 1, wherein the barrier metal layer is alloyed with the first electrode by an RTN (Rapid Thermal Nitridation) process.
7. A semiconductor device according to claim 1, wherein the first contact hole is formed by a two-step process, in which an intermediate hole is formed to an upper surface of the first insulating layer in a first step and the first contact hole is completed in a second step.
8. A semiconductor device according to claim 7, wherein the first and second steps are of etching process with different process conditions.
9. A semiconductor device according to claim 1, wherein the first electrode is a lower gate of a capacitor, and the second electrode is an upper gate of a capacitor.
10. A semiconductor device according to claim 1, further comprising: a non-volatile memory cell formed on the semiconductor substrate.
11. A semiconductor device according to claim 10, wherein the non-volatile memory cell includes
a source region formed on the semiconductor substrate;
a drain region formed on the semiconductor substrate;
a tunnel oxide layer formed over the source and drain regions;
a second contact hole formed through the interlayer dielectric between one of the source and drain regions and the wiring layer; and
a third contact hole formed through the interlayer dielectric between one of the source and drain regions and the wiring layer.
12. A semiconductor device according to claim 1, wherein the second insulating layer is superposed between the first electrode and the second electrode.
13. A semiconductor device according to claim 1, wherein at least a portion of the second electrode is directly over the first electrode.
14. A method for fabricating a semiconductor device, comprising:
providing a semiconductor substrate;
forming a first insulating layer on the semiconductor substrate;
forming a first electrode on the first insulating layer;
forming an interlayer dielectric over the first electrode;
forming a first contact hole to pass through the first electrode and the interlayer dielectric, and to terminate at an inside of the first insulating layer;
forming a barrier metal layer on an inner surface of the first contact hole;
forming a wiring layer on the first contact hole so that the wiring layer is electrically coupled to the first electrode;
forming a second insulating layer over the first electrode;
forming a second electrode on the second insulating layer; and
forming a second contact hole above the first insulating layer so as to be connected to the second electrode.
15. A method for fabricating a semiconductor device according to claim 14, further comprising: alloying the barrier metal layer with the first electrode.
16. A method for fabricating a semiconductor device according to claim 15, wherein the barrier metal layer is alloyed with the first electrode by an RTN (Rapid Thermal Nitridation) process.
17. A method for fabricating a semiconductor device according to claim 14, wherein the first insulating layer is an element-isolation region formed by LOCOS technique.

18. A method for fabricating a semiconductor device according to claim 14, wherein the first electrode is a lower gate of a capacitor, and the second electrode is an upper gate of a capacitor.

19. A method for fabricating a semiconductor device according to claim 14, wherein the barrier metal layer is of a material selected from Ti, W, Mo, TiSi, TiN, TiW and WSi.

20. A method for fabricating a semiconductor device according to claim 14, wherein the barrier metal layer is of Ti (titanium) and the first electrode is of Poly-Silicon.

21. A method for fabricating a semiconductor device according to claim 14, wherein the step forming the first contact hole includes
    forming an intermediate hole to an upper surface of the first insulating layer; and
    completing the first contact hole to get into the first insulating layer.

22. A method for fabricating a semiconductor device according to claim 21, wherein the step forming the first contact hole is carried out by two step of etching process with different conditions.

23. A method for fabricating a semiconductor device according to claim 14, further comprising: forming a non-volatile memory cell on the semiconductor substrate.

24. A method for fabricating a semiconductor device according to claim 23, wherein the non-volatile memory cell includes
    a source region formed on the semiconductor substrate;
    a drain region formed on the semiconductor substrate;
    a tunnel oxide layer formed over the source and drain regions;
    a second contact hole formed through the interlayer dielectric between one of the source and drain regions and the wiring layer; and
    a third contact hole formed through the interlayer dielectric between one of the source and drain regions and the wiring layer.

25. A semiconductor device according to claim 13, wherein at least a portion of the second insulating layer is disposed directly over the first electrode, and directly under the second electrode.

* * * * *